United States Patent
Uetake

(10) Patent No.: US 6,552,539 B2
(45) Date of Patent: Apr. 22, 2003

(54) METHOD OF CORRECTING RESONANCE FREQUENCY VARIATION AND MRI APPARATUS

(75) Inventor: Nozomu Uetake, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/116,652

(22) Filed: Apr. 3, 2002

(65) Prior Publication Data

US 2002/0145424 A1 Oct. 10, 2002

(30) Foreign Application Priority Data

Apr. 4, 2001 (JP) ........................................ 2001-105528

(51) Int. Cl.[7] .................................................. G01V 3/00
(52) U.S. Cl. ........................................ 324/307; 324/309
(58) Field of Search ................................ 324/307, 309, 324/306, 312, 318, 314; 600/410

(56) References Cited

U.S. PATENT DOCUMENTS

| | | | | |
|---|---|---|---|---|
| 4,780,675 A | * | 10/1988 | DeMeester et al. | 324/312 |
| 5,361,028 A | * | 11/1994 | Kanayama | 324/307 |
| 5,742,163 A | * | 4/1998 | Liu et al. | 324/309 |
| 6,242,914 B1 | * | 6/2001 | Yoshitome | 324/309 |

* cited by examiner

Primary Examiner—Edward Lefkowitz
Assistant Examiner—Brij B. Shrivastav
(74) Attorney, Agent, or Firm—Carl B. Horton, Esq.; Armstrong Teasdale LLP

(57) ABSTRACT

A method of correcting a resonance frequency variation and an MRI apparatus both capable of handling all frequency drifts including a frequency drift whose time change is slow, a frequency drift in a slice direction and a frequency drift whose time change is fast. An amount of a resonance frequency variation is measured, the frequency variation is corrected when an amount of the resonance frequency variation is smaller than a threshold value, and the amount of the resonance frequency variation is not stored. On the other hand, when the amount of the resonance frequency variation is not smaller than the threshold value, the amount of the resonance frequency variation is stored and correction operation is made based thereon later.

40 Claims, 8 Drawing Sheets

MRI apparatus 100

Δfd = fd - fo    N = M
R = 5

| n ( = d) | 1 | 2 | 3 | 4 | 5 | 6 | 7 | 8 | 9 | 10 | 11 | 12 | 13 |
|---|---|---|---|---|---|---|---|---|---|---|---|---|---|
| Δfd | 0 | 1 | 2 | 2 | 3 | 4 | 9 | 20 | 9 | 7 | 7 | 6 | 5 |

FIG. 9

$\Delta fd = fd - fo$    $N = M$    $\Delta fd' = \Delta f_{d-1} + \dfrac{\Delta f_{d-1} - \Delta f_{d-3}}{2}$
$\epsilon = 3$    Initial value of R = 10

| n ( = d) | 1 | 2 | 3 | 4 | 5 | 6 | 7 | 8 | 9 | 10 | 11 | 12 | 13 |
|---|---|---|---|---|---|---|---|---|---|---|---|---|---|
| $\Delta$ fd | 0 | 1 | 2 | 2 | 3 | 4 | 9 | 20 | 9 | 7 | 7 | 6 | 5 |
| $\Delta$ fd' |  | 0 | 2 | 3 | 3 | 4 | 5 | 12 | 28 | 9 | 1 | 6 | 6 | 4 |
| \|$\Delta$ fd - $\Delta$ fd'\| |  | 1 | 0 | 1 | 0 | 0 | 4 | 8 | 17 | 2 | 6 | 0 | 1 |
| R | 10 | 10 | 10 | 10 | 10 | 10 | 5 | 5 | 5 | 9 | 9 | 9 | 9 |

FIG. 10

$\Delta fd = fd - f_{d-1}$    $N = M$
$R = 5$

| n ( = d) | 1 | 2 | 3 | 4 | 5 | 6 | 7 | 8 | 9 | 10 | 11 | 12 | 13 |
|---|---|---|---|---|---|---|---|---|---|---|---|---|---|
| fd - fo | 0 | 1 | 2 | 2 | 3 | 4 | 9 | 20 | 9 | 7 | 7 | 6 | 5 |
| $\Delta$ fd | 0 | 1 | 1 | 0 | 1 | 1 | 5 | 11 | -11 | -2 | 0 | -1 | -1 |

FIG. 11

$\Delta fd = fd - f_{d-1}$    $N = M$    $\Delta fd' = \Delta f_{d-1} + \dfrac{\Delta f_{d-1} - \Delta f_{d-3}}{2}$
$\epsilon = 3$    Initial value of R = 10

| n ( = d) | 1 | 2 | 3 | 4 | 5 | 6 | 7 | 8 | 9 | 10 | 11 | 12 | 13 |
|---|---|---|---|---|---|---|---|---|---|---|---|---|---|
| fd - fo | 0 | 1 | 2 | 2 | 3 | 4 | 9 | 20 | 9 | 7 | 7 | 6 | 5 |
| $\Delta$ fd | 0 | 1 | 1 | 0 | 1 | 1 | 5 | 11 | -11 | -2 | 0 | -1 | -1 |
| $\Delta$ fd' |  | 0 | 1 | 1 | 0 | 1 | 1 | 7 | 16 | -19 | -6 | 5 | -1 | -1 |
| \|$\Delta$ fd - $\Delta$ fd'\| |  | 1 | 0 | 1 | 1 | 0 | 4 | 4 | 27 | 17 | 6 | 6 | 0 |
| R | 10 | 10 | 10 | 10 | 10 | 10 | 1 | 1 | 1 | 1 | 1 | 1 | 1 |

METHOD OF CORRECTING RESONANCE FREQUENCY VARIATION AND MRI APPARATUS

CROSS REFERENCE TO RELATED APPLICATIONS

REFERENCE TO RELATED APPLICATIONS

This application claims the benefit of Japanese Application No. 2001-105528 filed Apr. 4, 2001.

BACKGROUND OF THE INVENTION

The present invention relates to a method of correcting a resonance frequency variation and an MRI (Magnetic Resonance Imaging) apparatus and, more specifically, to a method of correcting a resonance frequency variation, which is capable of handling all frequency drifts caused by fluctuations in magnetic field including a frequency drift whose time change is slow, a frequency drift in a slice direction and a frequency drift whose time change is fast.

As a first prior art, Japanese Laid-open Patent Publication No. 1-141656 discloses a technology for correcting a frequency drift (resonance frequency variation) caused by fluctuations in magnetic field by collecting correction data as well at the time of collecting imaging data for filling a k space by repeating a sequence of imaging pulses which differ in phase encoding quantity a plurality of times and adjusting the amount of a current running through a magnetostatic coil based on the collected correction data.

As a second prior art, Japanese Patent No. 2528864 disclose a technology for making phase correction operation on imaging data according to magnetostatic intensity by measuring and storing the magnetostatic intensities of a plurality of points.

In the above first prior art, since correction based on correction data collected at the time of a sequence of imaging pulses of a certain time cannot be in time for the imaging data of this time and is effective for imaging data of the next time, a frequency drift whose time change is fast cannot be handled though a frequency drift whose time change is slow has no problem.

In the above second prior art, since imaging data collected at a certain time can be corrected based on correction data collected at the time of a sequence of imaging pulses of that time, a frequency drift whose time change is fast can be handled. However, since the processing is made after the collection of data, correction is effective for a sliced surface alone and a frequency drift in a slice direction cannot be handled.

SUMMARY OF THE INVENTION

It is therefore an object of the present invention to provide a method of correcting a resonance frequency variation, which is capable of handling all frequency drifts including a frequency drift whose time change is slow, a frequency drift in a slice direction and a frequency drift whose time change is fast as well as an MRI apparatus.

According to a first aspect of the present invention, there is provided a method of correcting a resonance frequency variation, comprising the steps of, measuring an amount of a resonance frequency variation as well each time when imaging data for filling a k space is collected by repeating a sequence of imaging pulses which differ in phase encoding amount a plurality of times, correcting the frequency variation when the amount of the resonance frequency variation is smaller than a threshold value, storing the amount of the resonance frequency variation or the resonance frequency in correspondence to the imaging data of this time without correcting the frequency variation when the amount of the resonance frequency variation is not smaller than the threshold value, and making correction operation on the imaging data when an amount of a resonance frequency variation or resonance frequency is stored in correspondence to a certain phase encoding amount of imaging data after the collection of the imaging data for filling the k space.

When the amount of the resonance frequency variation is smaller than the threshold value, as the resonance frequency variation is not a frequency drift whose time change is fast, it will suffice without correcting the imaging data of this time if the correction of the imaging data of the next time is effective. Therefore, only the correction of a frequency variation has to be carried out and the amount of a resonance frequency variation or resonance frequency does not need to be stored. On the other hand, when the amount of the resonance frequency variation is not smaller than the threshold value, as the resonance frequency variation is a frequency drift whose time change is fast, correction must be made on the imaging data of this time as well. Therefore, the amount of the resonance frequency variation or the resonance frequency is stored and correction operation may be made based thereon.

The method of correcting a resonance frequency variation according to the first aspect of the present invention is based on the above principle and makes frequency variation correction on a frequency drift whose time change is slow, thereby making it possible to handle a frequency drift in a slice direction as well. Meanwhile, since correction operation is made on a frequency drift whose time change is fast later, the imaging data of this time can be corrected. When correction operation is made later, frequency variation correction is not made to simplify control.

According to a second aspect of the present invention, there is provided a method of correcting a resonance frequency variation, comprising the steps of, measuring an amount of a resonance frequency variation as well each time when imaging data for filling a k space is collected by repeating a sequence of imaging pulses which differ in phase encoding amount a plurality of times, correcting the frequency variation, storing the amount of the resonance frequency variation or the resonance frequency in correspondence to the imaging data of this time when the amount of the resonance frequency variation is not smaller than a threshold value, and making correction operation on the imaging data when an amount of a resonance frequency variation or resonance frequency is stored in correspondence to a certain phase encoding amount of imaging data after the collection of the imaging data for filling the k space.

The method of correcting a resonance frequency variation according to the above second aspect of the present invention is based on the above principle and makes frequency variation correction on a frequency drift whose time change is slow, thereby making it possible to handle a frequency drift in a slice direction as well. Meanwhile, since correction operation is made on a frequency drift whose time change is fast later, the imaging data of this time can be corrected. Since frequency variation correction is made even when correction operation is made later, a frequency drift in a slice direction can always be handled.

According to a third aspect of the present invention, there is provided a method of correcting a resonance frequency variation, comprising the steps of, measuring an amount of a resonance frequency variation as well once out of a plurality of times when imaging data for filling a k space is collected by repeating a sequence of imaging pulses which differ in phase encoding amount a plurality of times, correcting the frequency variation when the amount of the resonance frequency variation is smaller than a threshold value, storing the amount of the resonance frequency variation or the resonance frequency in correspondence to the imaging data of the plurality of times without correcting the frequency variation when the amount of the resonance frequency variation is not smaller than the threshold value, and making correction operation on the imaging data when an amount of a resonance frequency variation or resonance frequency is stored in correspondence to a certain phase encoding amount of imaging data after the collection of the imaging data for filling the k space.

The method of correcting a resonance frequency variation according to the above third embodiment is based on the above principle and makes frequency variation correction on a frequency drift whose time change is slow, thereby making it possible to handle a frequency drift in a slice direction as well. Meanwhile, since correction operation is made on a frequency drift whose time change is fast later, imaging data of this time can be corrected. When correction operation is made later, frequency variation correction is not made to simplify control. Since the amount of a resonance frequency variation is measured once every a plurality of sequences of imaging pulses, the total scanning time can be shortened.

According to a fourth aspect of the present invention, there is provided a method of correcting a resonance frequency variation, comprising the steps of, measuring an amount of a resonance frequency variation as well once out of a plurality of times when imaging data for filling a k space is collected by repeating a sequence of imaging pulses which differ in phase encoding amount a plurality of times, correcting the frequency variation, storing the amount of the resonance frequency variation or the resonance frequency in correspondence to the imaging data of the plurality of times when the amount of the resonance frequency variation is not smaller than a threshold value, and making correction operation on the imaging data when an amount of a resonance frequency variation or resonance frequency is stored in correspondence to a certain phase encoding amount of imaging data after the collection of the imaging data for filling the k space.

The method of correcting a resonance frequency variation according to the above fourth aspect of the present invention is based on the above principle and makes frequency variation correction on a frequency drift whose time change is slow, thereby making it possible to handle a frequency drift in a slice direction as well. On the other hand, since correction operation is made on a frequency drift whose time change is fast later, the imaging data of this time can be corrected. Meanwhile, since frequency variation correction is carried out even when correction operation is made later, a frequency drift in a slice direction can always be handled. Since the amount of a resonance frequency variation is measured only once every a plurality of sequences of imaging pulses, the total scanning time can be shortened.

According to a fifth aspect of the present invention, there is provided a method of correcting a resonance frequency variation, comprising the steps of, measuring an amount of a resonance frequency variation as well each time when imaging data for filling a k space is collected by repeating a sequence of imaging pulses which differ in phase encoding amount a plurality of times, correcting the frequency variation, storing the amount of the resonance frequency variation or the resonance frequency in correspondence to the imaging data of this time, and making correction operation on the imaging data after the collection of the imaging data for filling the k space.

The method of correcting a resonance frequency variation according to the above fifth aspect of the present invention is based on the above principle and carries out frequency variation correction and also makes correction operation later, thereby making it possible to handle both a frequency drift whose time change is slow and a frequency drift whose time change is fast.

According to a sixth aspect of the present invention, there is provided a method of correcting a resonance frequency variation, comprising the steps of, measuring an amount of a resonance frequency variation as well once out of a plurality of times when imaging data for filling a k space is collected by repeating a sequence of imaging pulses which differ in phase encoding amount a plurality of times, correcting the frequency variation, storing the amount of the resonance frequency variation or the resonance frequency in correspondence to the imaging data of the plurality of times, and making correction operation on the imaging data after the collection of the imaging data for filling the k space.

The method of correcting a resonance frequency variation according to the above sixth aspect of the present invention is based on the above principle and carries out frequency variation correction and also makes correction operation later, thereby making it possible to handle both a frequency drift whose time change is slow and a frequency drift whose time change is fast.

According to a seventh aspect of the present invention, there is provided a method of correcting a resonance frequency variation, wherein the resonance frequency is measured and a difference between the measured resonance frequency and a fixed resonance frequency is taken as the amount of the resonance frequency variation in the above method of correcting a resonance frequency variation.

Since a difference between the measured resonance frequency and the fixed resonance frequency is taken as the amount of the resonance frequency variation in the above method of correcting a resonance frequency variation according to the above seventh aspect of the present invention, the resonance frequency is easily obtained from the amount of the resonance frequency variation.

According to an eighth aspect of the present invention, there is provided a method of correcting a resonance frequency variation, wherein the resonance frequency is measured and a difference between the measured resonance frequency and the previously measured resonance frequency is taken as the amount of the resonance frequency variation in the above method of correcting a resonance frequency variation.

Since a difference between the measured resonance frequency and the previously measured resonance frequency is taken as the amount of the resonance frequency variation in the method of correcting a resonance frequency variation according to the eight aspect of the present invention, the size of the variation can be easily grasped.

According to a ninth aspect of the present invention, there is provided a method of correcting a resonance frequency variation, wherein the threshold value is a fixed value in the above method of correcting a resonance frequency variation.

Since the threshold value is a fixed value in the method of correcting a resonance frequency variation according to the ninth aspect of the present invention, the processing becomes easy.

According to a tenth aspect of the present invention, there is provided a method of correcting a resonance frequency variation, wherein the threshold value is altered according to a change in the amount of the resonance frequency variation in the above method of correcting a resonance frequency variation.

Since the threshold value is altered according to a change in the amount of the resonance frequency variation in the method of correcting a resonance frequency variation according to the tenth aspect of the present invention, the threshold value can be dynamically optimized.

According to an eleventh aspect of the present invention, there is provided a method of correcting a resonance frequency variation, wherein the amount of a current running through a main magnetic field coil is adjusted to correct the frequency variation in the above method of correcting a resonance frequency variation.

Since the amount of a current running through the main magnetic coil is adjusted to correct a frequency drift in the method of correcting a resonance frequency variation according to the eleventh aspect of the present invention, the image quality can be improved.

According to a twelfth aspect of the present invention, there is provided a method of correcting a resonance frequency variation, wherein a transmitting frequency is adjusted to correct the frequency variation in the above method of correcting a resonance frequency variation.

Since a transmitting frequency is adjusted to correct a frequency drift in the method of correcting a resonance frequency variation according to the eleventh aspect of the present invention, the image quality can be improved.

According to a thirteenth aspect of the present invention, there is provided a method of correcting a resonance frequency variation, wherein the transmitting frequency and a receiving frequency are adjusted to correct the frequency variation in the above method of correcting a resonance frequency variation.

Since the transmitting frequency and the receiving frequency are adjusted to correct a magnetic field drift in the method of correcting a resonance frequency variation according to the thirteenth aspect of the present invention, the image quality can be improved.

According to a fourteenth aspect of the present invention, there is provided a method of correcting a resonance frequency variation, wherein a transmitting phase or a receiving phase is adjusted to correct the frequency variation in the above method of correcting a resonance frequency variation.

Since a transmitting phase or a receiving phase is adjusted to correct a magnetic field drift in the method of correcting a resonance frequency variation according to the fourteenth aspect of the present invention, the image quality can be improved.

According to a fifteenth aspect of the present invention, there is provided an MRI APPARATUS comprising, RF pulse transmitting means, gradient pulse application means, NMR signal receiving means, imaging data collection control means for collecting imaging data for filling a k space by repeating a sequence of imaging pulses which differ in phase encoding amount a plurality of times by controlling the above means, frequency variation measurement control means for measuring an amount of a resonance frequency variation as well each time when the imaging data is collected, frequency variation correction means for correcting a frequency variation when the amount of the resonance frequency variation is smaller than a threshold value, frequency variation storage means for storing the amount of the resonance frequency variation or the resonance frequency in correspondence to the imaging data of this time when the amount of the resonance frequency variation is not smaller than the threshold value, correction operation means for making correction operation on the imaging data when the amount of the resonance frequency variation or the resonance frequency is stored in correspondence to a certain phase encoding amount of imaging data after the collection of the imaging data for filling the k space, and reconstruction operation means for reconstructing an image from imaging data which does not require correction operation and imaging data after correction operation.

With the MRI APPARATUS according to the above fifteenth aspect of the present invention, the method of correcting a resonance frequency variation according to the first aspect of the present intention can be advantageously carried out.

According to a sixteenth aspect of the present invention, there is provided an MRI APPARATUS comprising, RF pulse transmitting means, gradient pulse application means, NMR signal receiving means, imaging data collection control means for collecting imaging data for filling a k space by repeating a sequence of imaging pulses which differ in phase encoding amount a plurality of times by controlling the above means, frequency variation measurement control means for measuring an amount of a resonance frequency variation as well each time when the imaging data is collected, frequency variation correction means for correcting a frequency variation, frequency variation storage means for storing the amount of the resonance frequency variation or the resonance frequency in correspondence to the imaging data of this time when the amount of the resonance frequency variation is not smaller than a threshold value, correction operation means for making correction operation on the imaging data when the amount of the resonance frequency variation or the resonance frequency is stored in correspondence to a certain phase encoding amount of imaging data after the collection of the imaging data for filling the k space, and reconstruction operation means for reconstructing an image from imaging data which does not require correction operation and imaging data after correction operation.

With the MRI APPARATUS according to the above sixteenth aspect of the present invention, the method of correcting a resonance frequency variation according to the above second aspect of the present invention can be advantageously carried out.

According to a seventeenth aspect of the present invention, there is provided an MRI APPARATUS comprising, RF pulse transmitting means, gradient pulse application means, NMR signal receiving means, imaging data collection control means for collecting imaging data for filling a k space by repeating a sequence of imaging pulses which differ in phase encoding amount a plurality of times by controlling the above means, frequency variation measurement control means for measuring an amount of a resonance frequency variation as well once out of a plurality of times when the imaging data is collected, frequency variation correction means for correcting a frequency variation when the amount of the resonance frequency variation is smaller than a threshold value, frequency variation storage means for storing the amount of the resonance frequency variation or the resonance frequency in correspondence to the imaging data of the plurality of times when the amount of the resonance frequency variation is not smaller than the threshold value, correction operation means for making correction operation on the imaging data when the amount of the resonance frequency variation or the resonance frequency is stored in correspondence to a certain phase encoding amount of imaging data after the collection of the imaging data for filling the k space, and reconstruction operation means for reconstructing an image from imaging data which does not require correction operation and imaging data after correction operation.

With the MRI APPARATUS according to the above seventeenth aspect of the present invention, the method of correcting a resonance frequency variation according to the above third aspect of the present invention can be advantageously carried out.

According to an eighteenth aspect of the present invention, there is provided an MRI APPARATUS comprising, RF pulse transmitting means, gradient pulse application means, NMR signal receiving means, imaging data collection control means for collecting imaging data for filling a k space by repeating a sequence of imaging pulses which differ in phase encoding amount a plurality of times by controlling the above means, frequency variation measurement control means for measuring an amount of a resonance frequency variation as well once out of a plurality of times when the imaging data is collected, frequency variation correction means for correcting a frequency variation, frequency variation storage means for storing the amount of the resonance frequency variation or the resonance frequency in correspondence to the imaging data of the plurality of times when the amount of the resonance frequency variation is not smaller than a threshold value, correction operation means for making correction operation on the imaging data when the amount of the resonance frequency variation or the resonance frequency is stored in correspondence to a certain phase encoding amount of imaging data after the collection of the imaging data for filling the k space, and reconstruction operation means for reconstructing an image from imaging data which does not require correction operation and imaging data after correction operation.

With the MRI APPARATUS according to the above eighteenth aspect of the present invention, the method of correcting a resonance frequency variation according to the above fourth aspect of the present invention ca be advantageously carried out.

According to a nineteenth aspect of the present invention, there is provided an MRI APPARATUS comprising, RF pulse transmitting means, gradient pulse application means, NMR signal receiving means, imaging data collection control means for collecting imaging data for filling a k space by repeating a sequence of imaging pulses which differ in phase encoding amount a plurality of times by controlling the above means, frequency variation measurement control means for measuring an amount of a resonance frequency variation as well each time when the imaging data is collected, frequency variation correction means for correcting a frequency variation, frequency variation storage means for storing the amount of the resonance frequency variation or the resonance frequency in correspondence to the imaging data of this time, correction operation means for making correction operation on the imaging data after the collection of the imaging data for filling the k space, and reconstruction operation means for reconstructing an image from imaging data after correction operation.

With the MRI APPARATUS according to the above nineteenth aspect of the present invention, the method of correcting a resonance frequency variation according to the above fifth aspect of the present invention can be advantageously carried out.

According to a twentieth aspect of the present invention, there is provided an MRI APPARATUS comprising, RF pulse transmitting means, gradient pulse application means, NMR signal receiving means, imaging data collection control means for collecting imaging data for filling a k space by repeating a sequence of imaging pulses which differ in phase encoding amount a plurality of times by controlling the above means, frequency variation measurement control means for measuring an amount of a resonance frequency variation as well once out of a plurality of times when the imaging data is collected, frequency variation correction means for correcting a frequency variation, frequency variation storage means for storing the amount of the resonance frequency variation or the resonance frequency in correspondence to the imaging data of the plurality of times, correction operation means for making correction operation on the imaging data after the collection of the imaging data for filling the k space, and reconstruction operation means for reconstructing an image from imaging data after correction operation.

With the MRI APPARATUS according to the above twentieth aspect of the present invention, the method of correcting a resonance frequency variation according to the above sixth aspect of the present invention can be advantageously carried out.

According to a twenty-first aspect of the present invention, there is provided an MRI apparatus, wherein the above frequency variation measurement control means measures a resonance frequency and a difference between the measured resonance frequency and a fixed resonance frequency is taken as the amount of the resonance frequency variation in the above MRI apparatus.

With the MRI apparatus according to the above twenty-first aspect of the present invention, the method of correcting a resonance frequency variation according to the above seventh aspect of the present invention can be advantageously carried out.

According to a twenty-second aspect of the present invention, there is provided an MRI APPARATUS, wherein the above frequency variation measurement control means measures a resonance frequency and a difference between the measured resonance frequency and the previously measured resonance frequency is taken as the amount of the resonance frequency variation in the above MRI apparatus.

With the MRI apparatus according to the above twenty-second aspect of the present invention, the method of correcting a resonance frequency variation according to the above eighth aspect of the present invention can be advantageously carried out.

According to a twenty-third aspect of the present invention, there is provided an MRI apparatus, wherein the threshold value is a fixed value in the above MRI apparatus.

With the MRI apparatus according to the above twenty-third aspect of the present invention, the method of correcting a resonance frequency variation according to the above ninth aspect of the present invention can be advantageously carried out.

According to a twenty-fourth aspect of the present invention, there is provided an MRI apparatus, wherein threshold value altering means for altering the threshold value according to a change in the amount of a resonance frequency variation is provided in the above MRI apparatus.

With the MRI apparatus according to the above twenty-fourth aspect of the present invention, the method of correcting a resonance frequency variation according to the above tenth aspect of the present invention can be advantageously carried out.

According to a twenty-fifth aspect of the present invention, there is provided an MRI apparatus, wherein the above frequency variation correction means adjusts an amount of a current running through a main magnetic field coil in the above MRI apparatus.

With the MRI apparatus according to the above twenty-fifth aspect of the present invention, the method of correcting a resonance frequency variation according to the above eleventh aspect of the present invention can be advantageously carried out.

According to a twenty-sixth aspect of the present invention, there is provided an MRI apparatus, wherein the above frequency variation correction means adjusts a transmitting frequency in the above MRI apparatus.

With the MRI apparatus according to the above twenty-sixth aspect of the present invention, the method of correcting a resonance frequency variation according to the above twelfth aspect of the present invention can be advantageously carried out.

According to a twenty-seventh aspect of the present invention, there is provided an MRI apparatus, wherein the above frequency variation correction means adjusts the transmitting frequency and a receiving frequency in the above MRI apparatus.

With the MRI apparatus according to the above twenty-seventh aspect of the present invention, the method of correcting a resonance frequency variation according to the above thirteenth aspect of the present invention can be advantageously carried out.

According to a twenty-eighth aspect of the present invention, there is provided an MRI apparatus, wherein the above frequency variation correction means adjusts a transmitting phase or a receiving phase in the above MRI apparatus.

With the MRI apparatus according to the above twenty-eighth aspect of the present invention, the method of correcting a resonance frequency variation according to the above fourteenth aspect of the present invention can be advantageously carried out.

Therefore, according to the method of correcting a resonance frequency variation and MRI apparatus of the present invention, all frequency drifts including a frequency drift whose time change is slow, a frequency drift in a slice direction and a frequency drift whose time change is fast can be handled, thereby making it possible to improve image quality.

Further objects and advantages of the present invention will be apparent from the following description of the preferred embodiments of the invention as illustrated in the accompanying drawings.

BRIEF DESCRIPTION OF THE DRAWINGS

FIG. 9 shows numerical values according to the fourth embodiment;

FIG. 10 shows numerical values according to a fifth embodiment; and

FIG. 11 shows numerical values according to a sixth embodiment.

DETAILED DESCRIPTION OF THE DRAWINGS

The present invention will be described in detail with reference to preferred embodiments of the present invention shown in the accompany drawings.

First Embodiment

Figure 1:
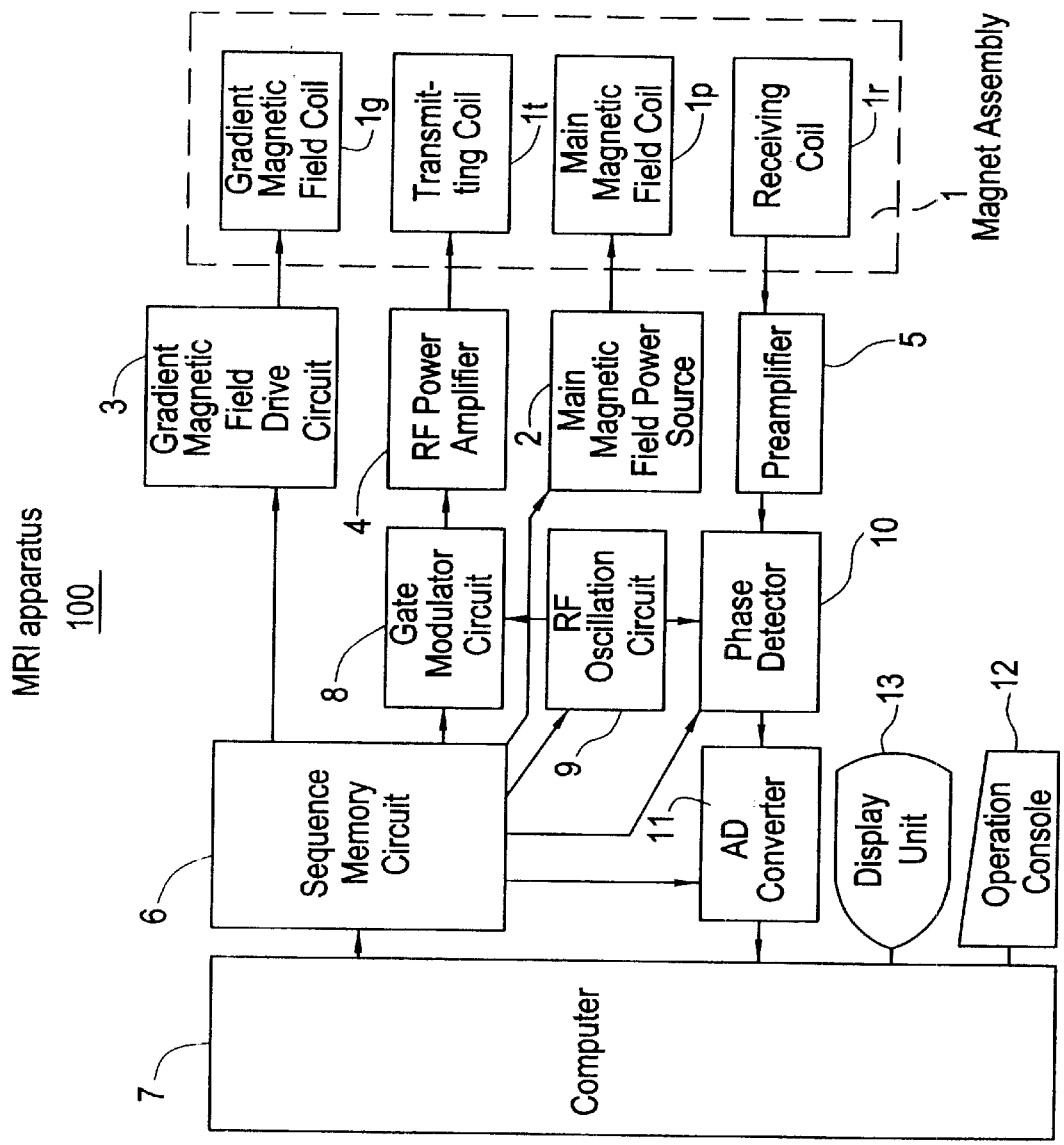
FIG. 1 is a block diagram of an MRI apparatus according to a first embodiment.

FIG. 1 is a block diagram of an MRI apparatus 100 according to a first embodiment of the present invention.

In this MRI apparatus 100, a magnet assembly 1 has a bore for accepting a sample therein and comprises a main magnetic field coil 1p for applying a fixed main magnetic field to the sample, a gradient magnetic field coil 1g for generating gradient magnetic fields for a slice axis, read axis and phase axis, a transmitting coil 1t for giving an RF pulse for exciting the spin of an atomic nucleus in the sample and a receiving coil 1r for detecting an NMR signal from the sample, all of which are disposed around the above bore. The above main magnetic field coil 1p, gradient magnetic field coil 1g, transmitting coil 1t and receiving coil 1r are connected to a main magnetic field power source 2, gradient magnetic field drive circuit 3, RF power amplifier 4 and pre-amplifier 5, respectively.

A permanent magnet may be used in place of the main magnetic field coil 1p.

A sequence memory circuit 6 activates the gradient magnetic field drive circuit 3 based on a stored pulse sequence according to an instruction from a computer 7 to generate a gradient magnetic field from the gradient magnetic field coil 1g of the above magnet assembly 1, activates a gate modulator circuit 8 to modulate the carrier output signal of an RF oscillation circuit 9 into a predetermined timing/predetermined envelope-shaped pulse signal and add the pulse signal to the RF power amplifier 4 as an RF pulse which is amplified by the RF power amplifier 4 and added to the transmitting coil 1t of the above magnet assembly 1 so that a desired slice area is selected and excited.

The preamplifier 5 amplifies an NMR signal from the sample, detected by the receiving coil 1r of the magnet assembly 1 and applies the amplified signal to a phase detector 10. The phase detector 10 detects the phase of the NMR signal from the preamplifier 5 based on the carrier output signal of the RF oscillation circuit 9 as a reference signal and applies the detected signal to an AD converter 11. The AD converter 11 converts the analog signal after phase detection into a digital signal and applies the digital signal to the computer 7.

The computer 7 reads data from the AD converter 11, carries out image reconstruction operation and generates an image for the desired slice area. This image is displayed on a display unit 13. The computer 7 is in charge of entire control such as reception of information from an operation console 12.

Figure 2:
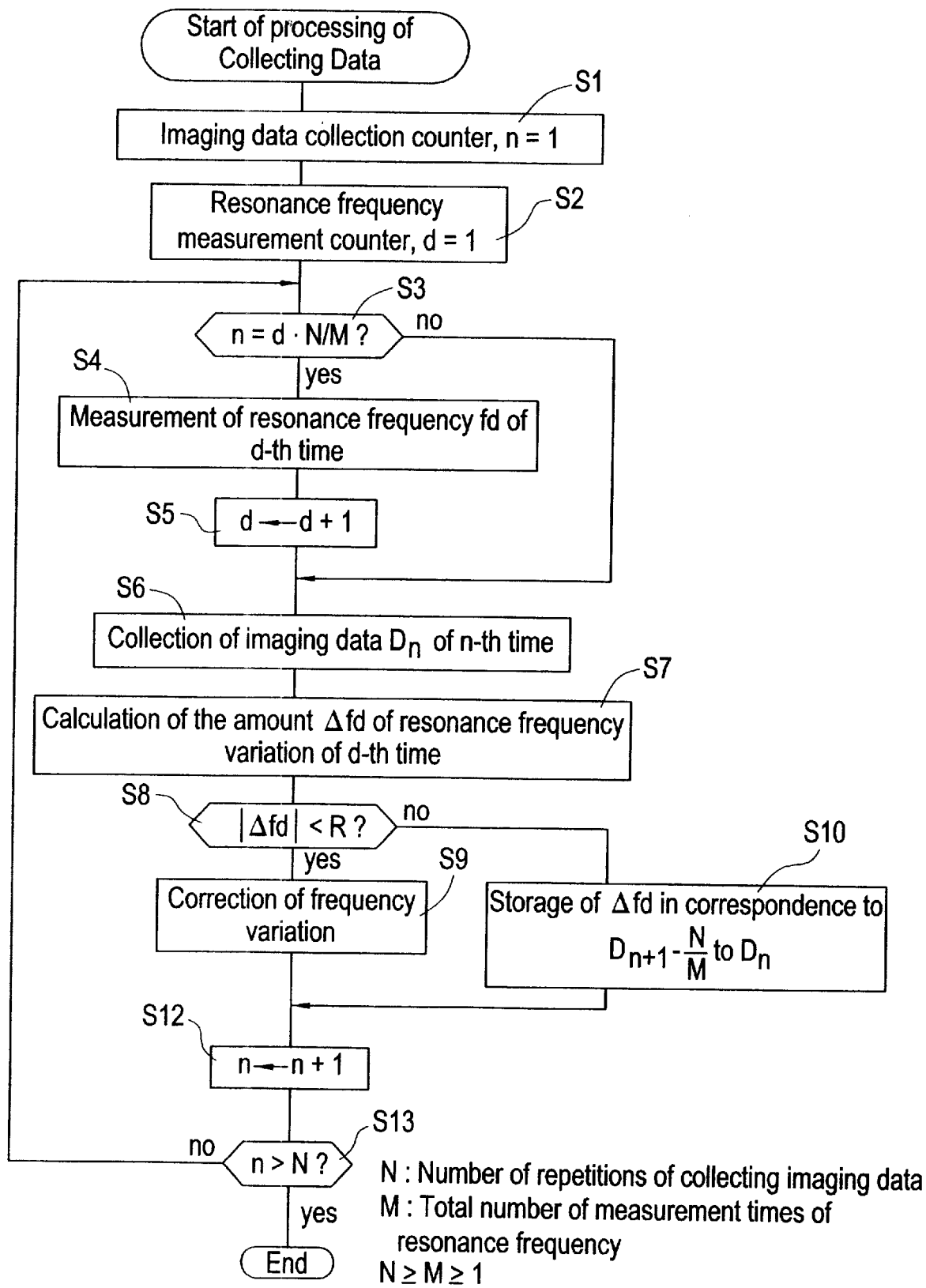
FIG. 2 is a flowchart showing the processing of collecting data according to the first embodiment.

FIG. 2 is a flowchart of the processing of collecting data by the above MRI apparatus 100. When the number of repetitions of an imaging pulse sequence is represented by N and the total number of times of resonance frequency measurement is represented by M, N≧M≧1.

In step S1, an imaging data counter n is initialized to "1".

In step S2, a resonance frequency measurement counter disinitialized to "1".

In step S3, when n=d·N/M, the processing proceeds to step S4 and when n is not equal to d·N/M, the processing proceeds to step S6.

In step S4, the resonance frequency fd of a d-th time is measured by a pulse sequence for resonance frequency measurement.

In step S5, the resonance frequency measurement counter d is incremented by "1" only. Then the processing proceeds to step S6.

In step S6, imaging data Dn of an n-th time is collected by an imaging pulse sequence.

Figures 3, 4:
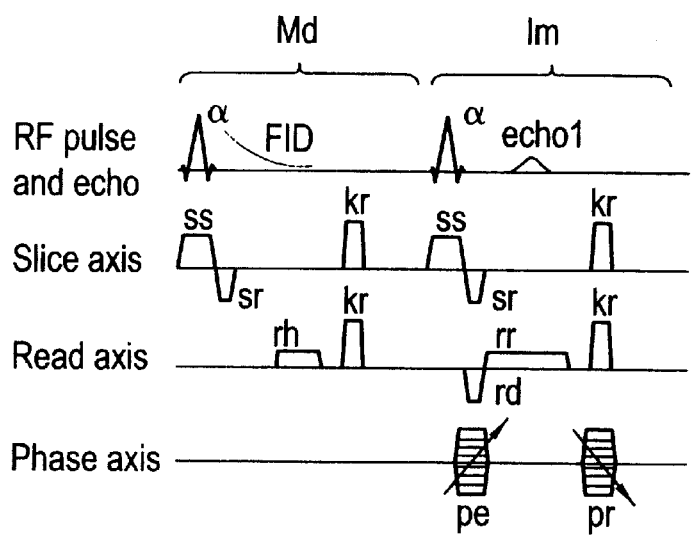
FIG. 3 shows first examples of a pulse sequence for resonance frequency measurement and an imaging pulse sequence.
FIG. 4 shows numerical values according to the first embodiment.

FIG. 3 shows examples of the pulse sequence Md for resonance frequency measurement and the imaging pulse sequence Im when N=256 and M=256.

A pulse sequence of a gradient echo method is used as the imaging pulse sequence Im.

A pulse sequence from which read gradient parts (former half parts of rd and rr) and phase gradients (pe and pr) for converging gradient echoes (echo1, echo2) in the above imaging pulse sequence Im are omitted is used as the pulse sequence Md for resonance frequency measurement. The resonance frequency fd is obtained from data collected from an FID signal.

To equalize the integral amounts of gradients for each axis, the integral amount of gradient magnetic fields (rd, rr) in the above imaging pulse sequence Im is made equal to the integral amount of a gradient magnetic field (rh) in the above pulse sequence Md for resonance frequency measurement. Since the integral amount of the gradient magnetic fields (pe, pr) in the above imaging pulse sequence Im becomes "0", a gradient magnetic field is not applied to the phase axis in the above pulse sequence Md for resonance frequency measurement.

Returning to FIG. 2, in step S7, the amount Δfd of a resonance frequency variation Of a d-th time is calculated. The amount Δfd of a resonance frequency variation can be obtained from any one of the following expressions.

(1) frequency difference from the reference resonance frequency fo $$\Delta fd = fd - fo$$

(2) frequency difference from the previously measured resonance frequency $f_{d-1}$ $$\Delta fd = fd - f_{d-1}$$

In step S8, the processing proceeds to step S9 when the absolute value |Δfd| of the amount Δfd of the resonance frequency variation is smaller than a threshold value R and to step S10 when the absolute value is not smaller than the threshold value. The threshold R is preset to an appropriate value obtained empirically.

In step S9, the correction of a frequency variation is carried out. The correction of a frequency variation may be carried out by using one of the following processes.

(a) The amount of a current running through the main magnetic field coil 1p is adjusted based on the amount Δfd of the resonance frequency variation.

(b) The transmission frequency of the RF oscillation circuit 9 is adjusted based on the amount Δfd of the resonance frequency variation.

(c) The transmission frequency and the reception frequency of the RF oscillation circuit 9 are adjusted based on the amount Δfd of the resonance frequency variation.

(d) The transmission phase of the gate modulator circuit 8 or the reception phase of the phase detector 10 is adjusted based on the amount Δfd of the resonance frequency variation.

The processing proceeds to step S12.

In step S10, the amount Δfd of the resonance frequency variation is stored in correspondence to imaging data $D_{n+1-N/M}$ to Dn of an (n+1−N/M)-th time to an n-th time. Then the processing proceeds to step S12.

In step S12, the imaging data collection counter n is incremented by "1" only.

In step S13, when n>N, the processing is ended and when n is not equal to or larger than N, the processing returns to step S3.

FIG. 4 shows numerical values when the amount Δfd of the resonance frequency variation=fd−fo and N=M.

When the threshold value R=5, as |Δfd|<R when n=1 to 6, the correction of the frequency variation is carried out. As |Δfd|≧R, when n=7 to 13, the correction of the frequency variation is not carried out and the amounts Δfd of resonance frequency variations within thick frame are stored in correspondence to imaging data Dn of an n-th time.

Figure 5:
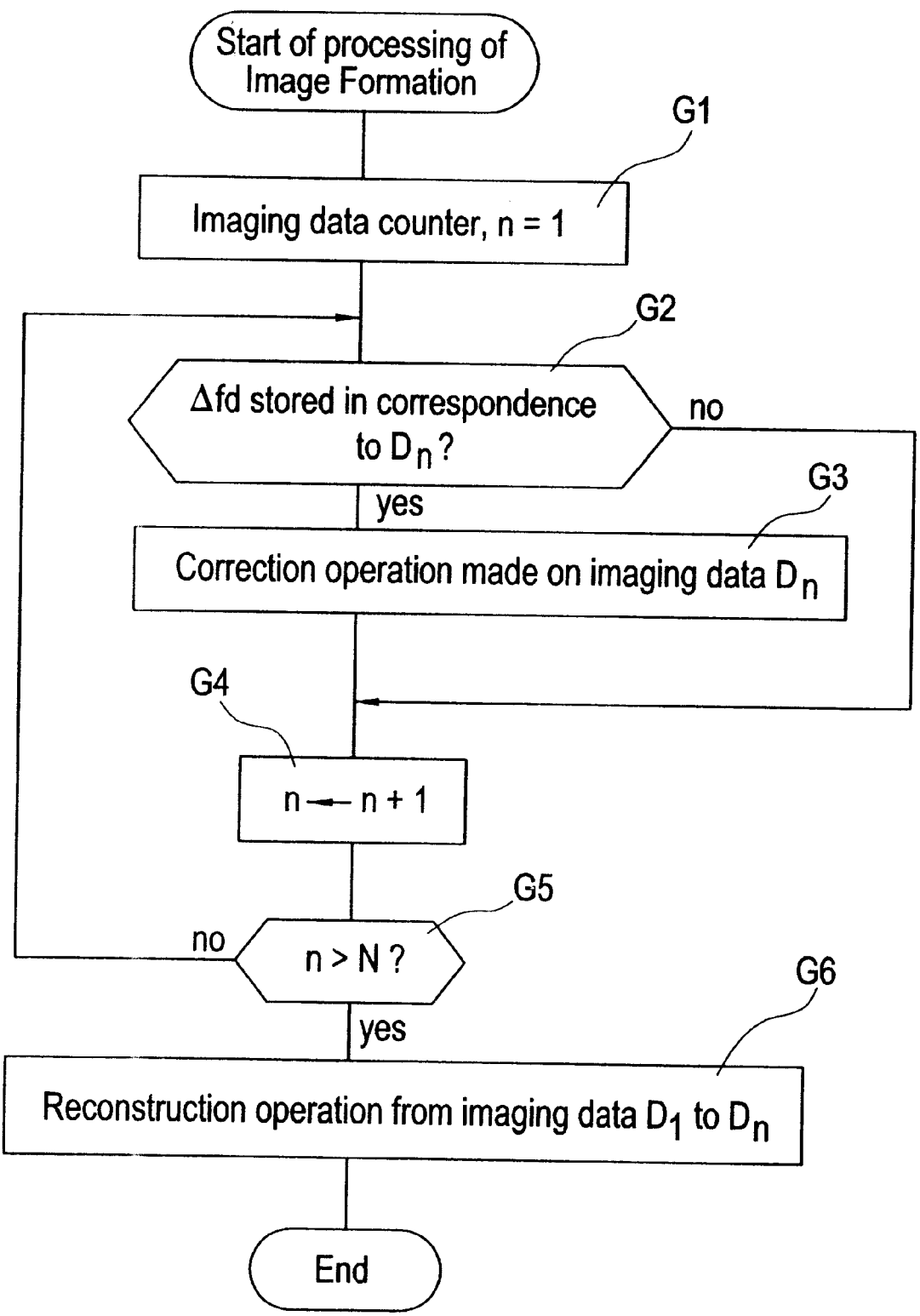
FIG. 5 is a flowchart of the processing of reconstructing an image according to the first embodiment.

FIG. 5 is a flowchart showing the processing of forming an image by the above MRI apparatus 100. In step G1, the imaging data counter n is initialized to "1".

In step G2, when the amount Δfd of the resonance frequency variation is stored in correspondence to the imaging data Dn, the processing proceeds to step G3 and when it is not stored, the processing proceeds to step G4.

In step G3, phase correction operation is made on the imaging data Dn based on the amount Δfd of the resonance frequency variation.

In step G4, the imaging data counter n is incremented by "1" only.

In step G5, when n>N, the processing proceeds to step G6 and when n is not equal to or larger than N, the processing returns to the above step G2.

In step G6, an image is reconstructed from imaging data $D_1$ to $D_N$. The processing is then ended.

With the MRI apparatus 100 according to the above first embodiment, the correction of a frequency variation is carried out on a frequency drift whose time change is slow and the subsequent resonance frequency variation can be handled. A frequency drift in a slice direction can also be handled. Meanwhile, since phase correction operation is made on a frequency drift whose time change is fast later, imaging data at the start of the frequency drift can also be corrected.

Second Embodiment

Figure 6:
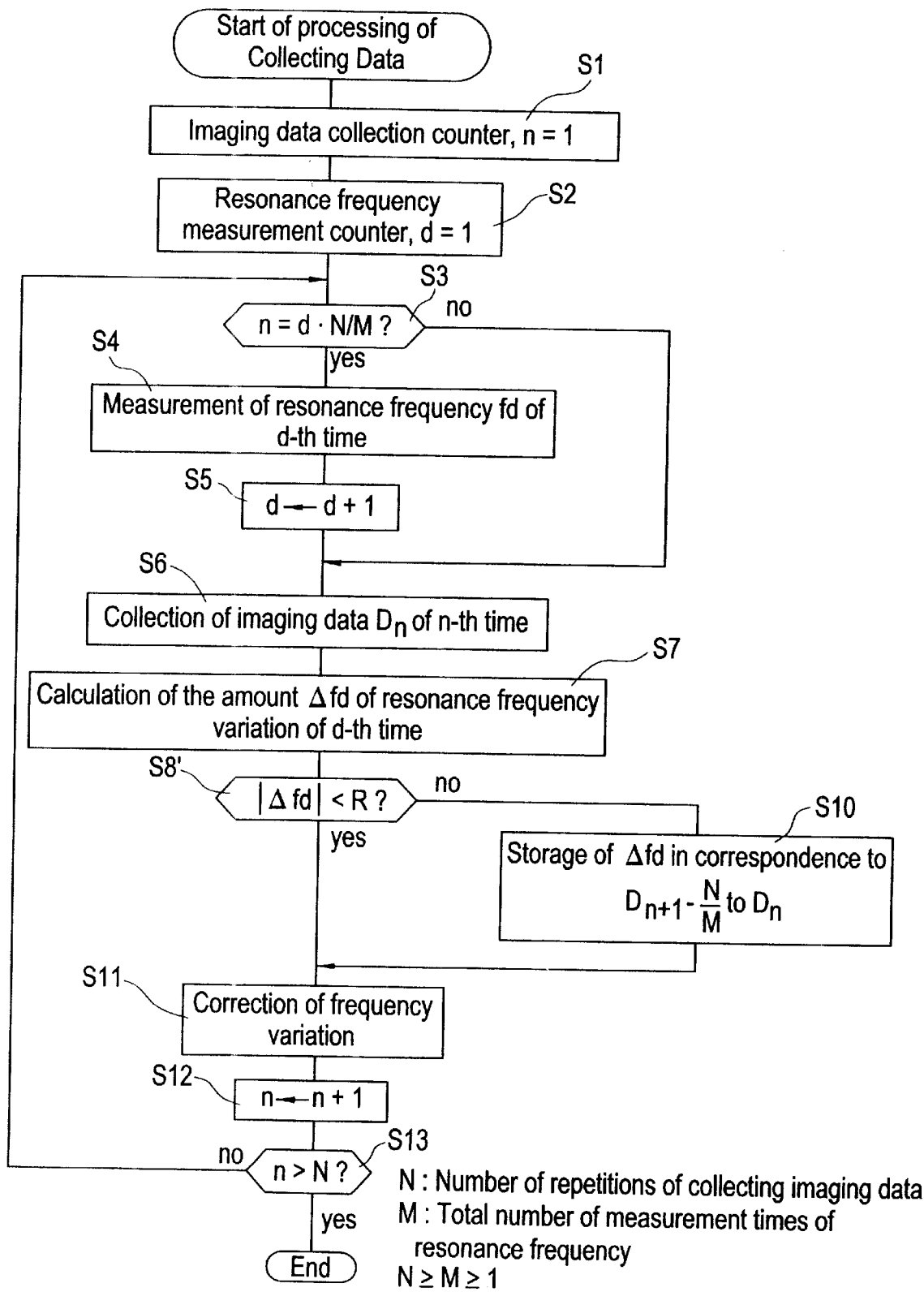
FIG. 6 is a flowchart of the processing of collecting data according to a second embodiment.

FIG. 6 is a flowchart showing the processing of collecting data by an MRI apparatus according to a second embodiment.

Step S1 to S7 are the same as those of the processing of collecting data according to the first embodiment.

In step S8', the processing proceeds to step S11 when the absolute value |Δfd| of the amount Δfd of a resonance frequency variation is smaller than the threshold value R and to step S10 when it is not smaller than the threshold value.

Step S10 is the same as that of the processing of collecting data according to the first embodiment.

Step S11 is the same as the step S9 of the processing of collecting data according to the first embodiment.

Steps S12 and S13 are the same as those of the processing of collecting data according to the first embodiment.

With the MRI apparatus according to the above second embodiment, as the correction of a frequency variation is always carried out on a frequency drift, the subsequent resonance frequency variation can be handled. A frequency drift in a slice direction can also be handled. On the other hand, since phase correction operation is made on a frequency drift whose time change is fast later, imaging data at the start of the frequency drift can also be corrected.

Third Embodiment

Figure 7:
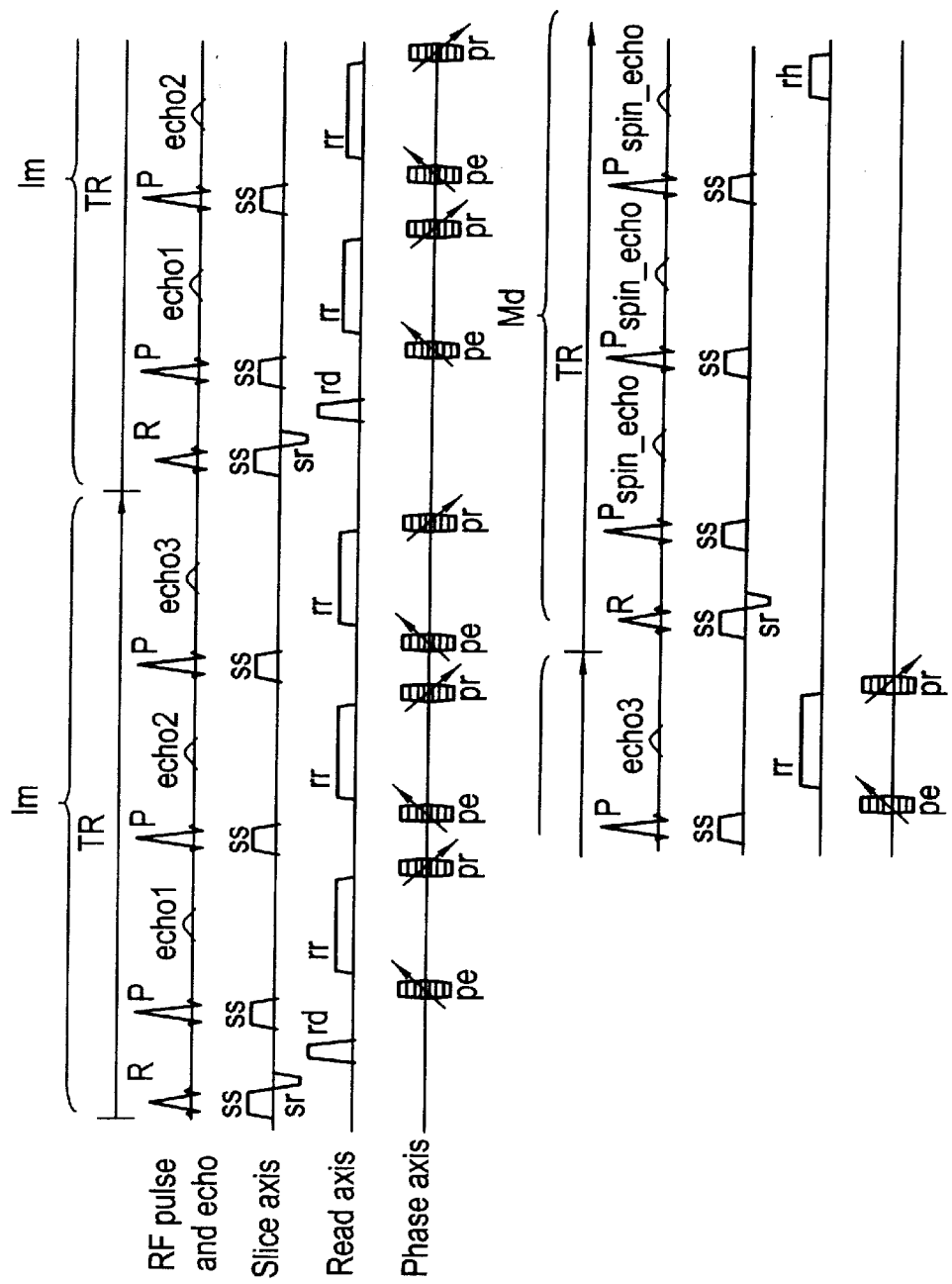
FIG. 7 shows second examples of a pulse sequence for resonance frequency measurement and an imaging pulse sequence.

FIG. 7 shows examples of the imaging pulse sequence Im and the pulse sequence Md for resonance frequency measurement when N=256 and M=128.

A pulse sequence of a high-speed spin echo method is used as the imaging pulse sequence Im.

A pulse sequence from which dephase read gradient parts (latter half parts of rd and rr) between 90° RF pulse R and 180° RF pulse P and between 180° RF pulse P and 180° RF pulse P, a read gradient part (former half part of rr) after 180° RF pulse P and a phase gradient (pe) corresponding to these in the above imaging pulse sequence Im are omitted is used as the pulse sequence Md for resonance frequency measurement. The resonance frequency fd is obtained from the first spin_echo signal.

One pulse sequence for resonance frequency measurement is inserted after n=2, 4, 6, . . . , that is, every two imaging pulse sequences Im.

To equalize the integral amounts of gradients for each axis, the integral amounts of gradient magnetic fields (rd, rr) in the above imaging pulse sequence Im are made equal to the integral amount of a gradient magnetic field (rh) in the pulse sequence Md for resonance frequency measurement. Since the integral amounts of gradient magnetic fields (pe, pr) in the above imaging pulse sequence Im become "0", a gradient magnetic field is not applied to the phase axis in the pulse sequence Md for resonance frequency measurement.

When slice encoding is added to the slice axis of the pulse sequence of FIG. 7, a 3D pulse sequence is obtained.

With the MRI apparatus according to the above third embodiment, the same effect as in the first embodiment and the second embodiment is obtained. Since the amount Δfd of a resonance frequency variation is measured once every two imaging pulse sequences Im, the total scanning time can be shortened.

Fourth Embodiment

In the fourth embodiment, step S8 in the flowchart of FIG. 2 is omitted and step S10 is added after step S9. That is, the processing proceeds from step S7 to step S9, from step S9 to step S10 and from step S10 to step S12. Alternatively, step S8' in the flowchart of FIG. 6 is omitted and step S10 is added after step S7. That is, the processing proceeds from step S7 to step 10 and then from step S10 to step S11.

Further, step G2 in the flowchart of FIG. 5 is omitted. That is, step G3 is carried out for all n's.

With the MRI apparatus according to the above fourth embodiment, since the correction of a frequency variation is carried out (step S9 or step S11) and correction operation is also made later (step G3), both a frequency drift whose time change is slow and a frequency drift whose time change is fast can be handled.

Fifth Embodiment

Figure 8:
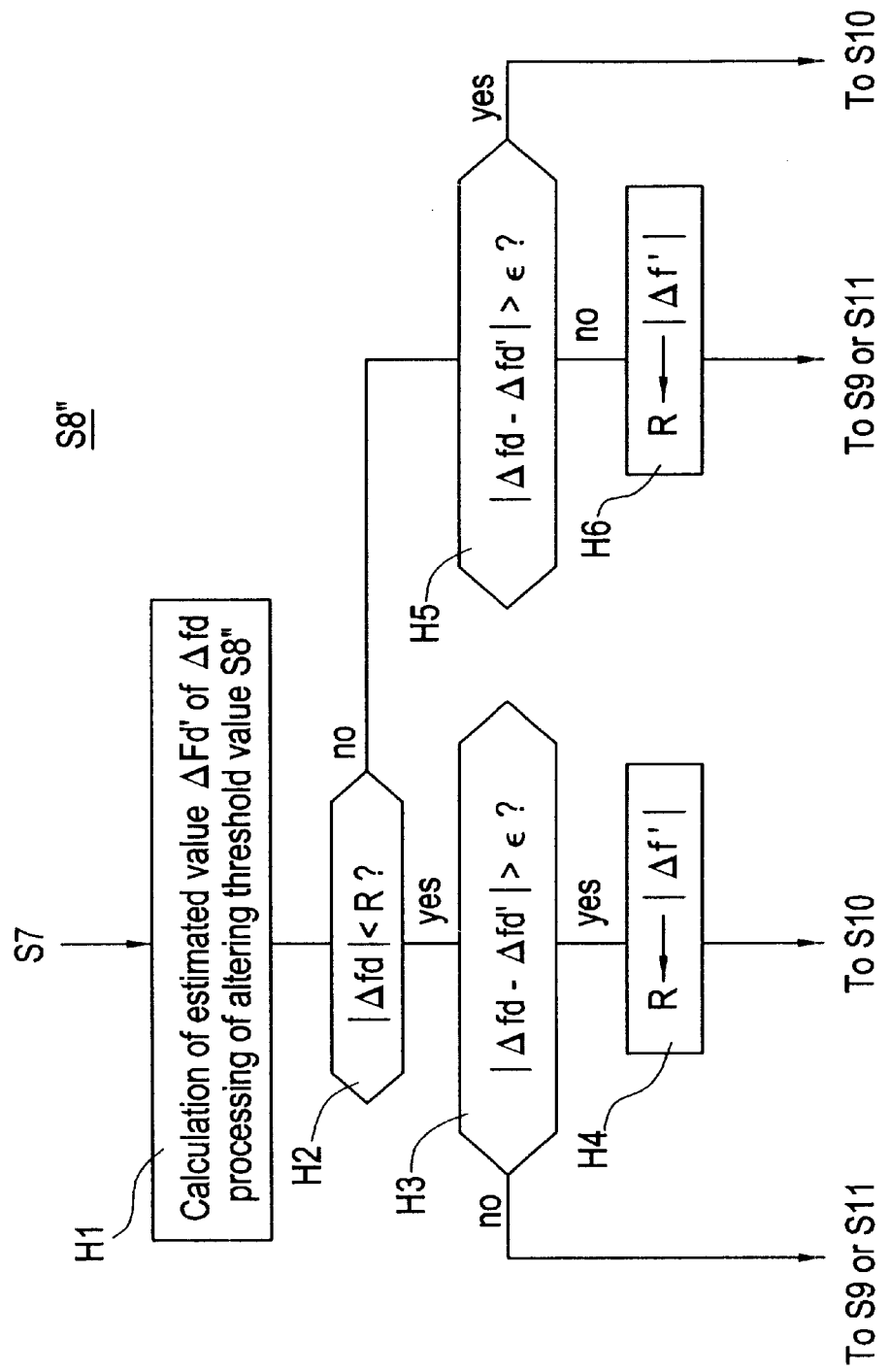
FIG. 8 is a flowchart of the processing of altering a threshold value according to a fourth embodiment.

In the fifth embodiment, step S8 in the processing of collecting data of FIG. 2 or FIG. 6 is replaced by the processing S8'' of changing the threshold value shown in FIG. 8.

In step H1 of FIG. 8, an estimated value Δfd' of the amount Δfd of a resonance frequency variation is calculated from a conventionally known estimation method. For example, this can be calculated from the following expression.

$$\Delta fd' = \Delta f_{d-1} + (\Delta f_{d-1} - \Delta f_{d-3})/2$$

In step H2, when the absolute value |Δfd| of the amount Δfd of a resonance frequency variation is smaller than the threshold value R, the processing proceeds to step H3 and when it is not, the processing proceeds to step H5.

In step H3, when the absolute value |Δfd−Δfd'| of the difference between the amount of Δfd of a resonance frequency variation and the estimated value Δfd' is larger than a decision value ε, the processing proceeds to step H4 and when it is not, the processing proceeds to step S9 in FIG. 2 or step S11 in FIG. 6. The decision value ε is preset to an appropriate value obtained empirically.

In step H4, the absolute value |Δfd| of the estimated value Δfd' is used as a new threshold value R. Then the processing proceeds to step S10 in FIG. 2 or FIG. 6.

In step H5, when the absolute value |Δfd−Δfd'| of the difference between the amount Δfd of a resonance frequency variation and the estimated value Δfd' is larger than the decision value ε, the processing proceeds to step S10 in FIG. 2 or FIG. 6 and when it is not, the processing proceeds to step H6.

In step H6, the absolute value |Δfd'| of the estimated value Δfd' is used as a,new threshold value R. Then the processing proceeds to step S9 in FIG. 2 or step S11 in FIG. 6.

FIG. 9 shows numerical values when Δfd=fd−fo, N=M, $\Delta fd' = \Delta f_{d-1} + (\Delta f_{d-1} - \Delta f_{d-3})/2$, ε=3 and initial value of R=10.

The threshold value is dynamically changed and the amounts Δfd of resonance frequency variations when n=7 to 9 within the thick frame are stored in correspondence to imaging data Dn of an n-th time.

With the MRI apparatus according to the above fifth embodiment, since the threshold value R is altered according to a change in the amount Δfd of a resonance frequency variation, the threshold value R can be dynamically optimized.

Sixth Embodiment

In the sixth embodiment, the amount Δfd of a resonance frequency variation is obtained from a difference between the resonance frequency fd of this time and the resonance frequency $f_{d-1}$ of the previous time.

FIG. 10 shows numerical values when $\Delta fd = fd - f_{d-1}$, N=M and R=5.

The differences fd−fo between the resonance frequencies fd when n=7 to 9 and the reference resonance frequency fo within the thick frame are stored in correspondence to the imaging data Dn of an n-th time. This is equivalent to the storage of the resonance frequencies fd when n=7 to 9 in correspondence to the imaging data Dn of an n-th time.

With the MRI apparatus according to the above sixth embodiment, the size of a change can be easily known from the amount Δfd of a resonance frequency variation.

Seventh Embodiment

In the seventh embodiment, the amount Δfd of a resonance frequency variation is obtained from a difference between the resonance frequency fd of this time and the resonance frequency $f_{d-1}$ of the previous time. The threshold value R is dynamically changed.

FIG. 11 shows numerical values when Δfd=fd−$f_{d-1}$, N=M, Δfd'=Δ$f_{d-1}$+(Δ$f_{d-1}$−Δ$f_{d-3}$)/2, ϵ=3 and initial value of R=10.

The threshold value R is dynamically changed and the differences fd−fo between the resonance frequencies fd when n=7 to 12 and the reference resonance frequency fo within the thick frame are stored in correspondence to the imaging data Dn of an n-th time. This is equivalent to the storage of the resonance frequencies fd when n=7 to 12 in correspondence to the imaging data Dn of an n-th time.

With the MRI apparatus according to the above seventh embodiment, since the threshold value R is altered by a change in the amount Δfd of a resonance frequency variation, the threshold value R can be dynamically optimized. Also, the size of a change can be easily known from the amount Δfd of a resonance frequency variation.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus comprising:
   an RF pulse transmitting device;
   a gradient pulse application device;
   an NMR signal receiving device;
   an imaging data collection control device for collecting imaging data for filling a k space by repeating a sequence of imaging pulses which differ in phase encoding amount a plurality of times by controlling the above device;
   a frequency variation measurement control device for measuring an amount of a resonance frequency variation as well each time when the imaging data is collected;
   a frequency variation correction device for correcting a frequency variation when the amount of the resonance frequency variation is smaller than a threshold value;
   a frequency variation storage device for storing the amount of the resonance frequency variation or the resonance frequency in correspondence to the imaging data of this time when the amount of the resonance frequency variation is not smaller than the threshold value;
   a correction operation device for making correction operation on the imaging data when the amount of the resonance frequency variation or the resonance frequency is stored in correspondence to a certain phase encoding amount of imaging data after the collection of the imaging data for filling the k space; and
   a reconstruction operation device for reconstructing an image from imaging data which does not require correction operation and imaging data after correction operation.

2. An MRI apparatus according to claim 1, wherein the threshold value is a fixed value.

3. An MRI apparatus according to claim 1, wherein threshold value altering device for altering the threshold value according to a change in the amount of a resonance frequency variation is provided.

4. An MRI apparatus comprising:
   an RF pulse transmitting device;
   a gradient pulse application device;
   an NMR signal receiving device;
   an imaging data collection control device for collecting imaging data for filling a k space by repeating a sequence of imaging pulses which differ in phase encoding amount a plurality of times by controlling the above device;
   a frequency variation measurement control device for measuring an amount of a resonance frequency variation as well each time when the imaging data is collected;
   a frequency variation correction device for correcting a frequency variation;
   a frequency variation storage device for storing the amount of the resonance frequency variation or the resonance frequency in correspondence to the imaging data of this time when the amount of the resonance frequency variation is not smaller than a threshold value;
   a correction operation device for making correction operation on the imaging data when the amount of the resonance frequency variation or the resonance frequency is stored in correspondence to a certain phase encoding amount of imaging data after the correction of the imaging data for filling the k space; and
   a reconstruction operation device for reconstructing an image from imaging data which does not require correction operation and imaging data after correction operation.

5. An MRI apparatus comprising:
   an RF pulse transmitting device;
   a gradient pulse application device;
   an NMR signal receiving device;
   an imaging data collection control device for collecting imaging data for filling a k space by repeating a sequence of imaging pulses which differ in phase encoding amount a plurality of times by controlling the above device;
   a frequency variation measurement control device for measuring an amount of a resonance frequency variation as well once out of a plurality of times when the imaging data is collected;
   a frequency variation correction device for correcting a frequency variation when the amount of the resonance frequency variation is smaller than a threshold value;
   a frequency variation storage device for storing the amount of the resonance frequency variation or the resonance frequency in correspondence to the imaging data of the plurality of times when the amount of the resonance frequency variation is not smaller than the threshold value;
   a correction operation device for making correction operation on the imaging data when the amount of the resonance frequency variation or the resonance frequency is stored in correspondence to a certain phase encoding amount of imaging data after the collection of the imaging data for filling the k space; and a reconstruction operation device for reconstructing an image from imaging data which does not require correction operation and imaging data after correction operation.

6. An MRI apparatus comprising:

an RF pulse transmitting device;

a gradient pulse application device;

an NMR signal receiving device;

an imaging data collection control device for collecting imaging data for filling a k space by repeating a sequence of imaging pulses which differ in phase encoding amount a plurality of times by controlling he above device;

a frequency variation measurement control device for measuring an amount of a resonance frequency variation as well once out of a plurality of times when the imaging data is collected;

a frequency variation correction device for correcting a frequency variation;

a frequency variation storage device for storing the amount of the resonance frequency variation or the resonance frequency in correspondence to the imaging data of the plurality of times when the amount of the resonance frequency variation is not smaller than a threshold value;

a correction operation device for making correction operation on the imaging data when the amount of the resonance frequency variation or the resonance frequency is stored in correspondence to a certain phase encoding amount of imaging data after the collection of the imaging data for filling the k space; and a reconstruction operation device for reconstructing an image from imaging data which does not require correction operation and imaging data after correction operation.

7. An MRI apparatus comprising:

an RF pulse transmitting device;

a gradient pulse application device;

an NMR signal receiving device;

an imaging data collection control device for collecting imaging data for filling a k space by repeating a sequence of imaging pulses which differ in phase encoding amount a plurality of times by controlling the above device;

a frequency variation measurement control device for measuring an amount of a resonance frequency variation as well each time when the imaging data is collected;

a frequency variation correction device for correcting a frequency variation;

a frequency variation storage device for storing the amount of the resonance frequency variation or the resonance frequency in correspondence to the imaging data of this time;

a correction operation device for making correction operation on the imaging data after the collection of the imaging data for filling the k space; and a reconstruction operation device for reconstructing an image from imaging data after correction operation.

8. An MRI apparatus according claim 7, wherein the frequency variation measurement control device measures a resonance frequency and a difference between the measured resonance frequency and a fixed resonance frequency is taken as the amount of the resonance frequency variation.

9. An MRI apparatus according to claim 7, wherein the frequency variation measurement control device measures a resonance frequency and a difference between the measured resonance frequency and the previously measured resonance frequency is taken as the amount of the resonance frequency variation.

10. An MRI apparatus according to claim 7, wherein the frequency variation correction device adjusts an amount of a current running through a main magnetic field coil.

11. An MRI apparatus according to claim 7, wherein the frequency variation correction device adjusts a transmitting frequency.

12. An MRI apparatus according to claim 7, wherein the frequency variation correction device adjusts the transmitting frequency and a receiving frequency.

13. An MRI apparatus according to claim 7, wherein the frequency variation correction device adjusts a transmitting phase or a receiving phase.

14. An MRI apparatus comprising:

an RF pulse transmitting device;

a gradient pulse application device;

an NMR signal receiving device;

an imaging data collection control device for collecting imaging data for filling a k space by repeating a sequence of imaging pulses which differ in phase encoding amount a plurality of times by controlling the above device;

a frequency variation measurement control device for measuring an amount of a resonance frequency variation as well once out of a plurality of times when the imaging data is collected;

a frequency variation correction device for correcting a frequency variation;

a frequency variation storage device for storing the amount of the resonance frequency variation or the resonance frequency in correspondence to the imaging data of the plurality of times;

a correction operation device for making correction operation on the imaging data after the collection of the imaging data for filling the k space; and a reconstruction operation device for reconstructing an image from imaging data after correction operation.

15. An MRI apparatus according claim 14, wherein the frequency variation measurement control device measures a resonance frequency and a difference between the measured resonance frequency and a fixed resonance frequency is taken as the amount of the resonance frequency variation.

16. An MRI apparatus according to claim 14, wherein the frequency variation measurement control device measures a resonance frequency and a difference between the measured resonance frequency and the previously measured resonance frequency is taken as the amount of the resonance frequency variation.

17. An MRI apparatus according to claim 14, wherein the frequency variation correction device adjusts an amount of a current running through a main magnetic field coil.

18. An MRI apparatus according to claim 14, wherein the frequency variation correction device adjusts a transmitting frequency.

19. An MRI apparatus according to claim 14, wherein the frequency variation correction device adjusts the transmitting frequency and a receiving frequency.

20. An MRI apparatus according to claim 14, wherein the frequency variation correction device adjusts a transmitting phase or a receiving phase.

21. A method of correcting a resonance frequency variation, comprising the steps of:

measuring an amount of a resonance frequency variation as well each time when imaging data for filling a k space is collected by repeating a sequence of imaging pulses which differ in phase encoding amount a plurality of times;

correcting the frequency variation when the amount of the resonance frequency variation is smaller than a threshold value;

storing the amount of the resonance frequency variation or the resonance frequency in correspondence to the imaging data of this time without correcting the frequency variation when the amount of the resonance frequency variation is not smaller than the threshold value; and making correction operation on the imaging data when an amount of a resonance frequency variation or resonance frequency is stored in correspondence to a certain phase encoding amount of imaging data after the collection of the imaging data for filling the k space.

22. A method of correcting a resonance frequency variation according to claim 21, wherein the threshold value is a fixed value.

23. A method of correcting a resonance frequency variation according to claim 21, wherein the threshold value is altered according to a change in the amount of the resonance frequency variation.

24. A method of correcting a resonance frequency variation, comprising the steps of:

measuring an amount of a resonance frequency variation as well each time when imaging data for filling a k space is collected by repeating a sequence of imaging pulses which differ in phase encoding amount a plurality of times;

correcting the frequency variation;

storing the amount of the resonance frequency variation or the resonance frequency in correspondence to the imaging data of this time when the amount of the resonance frequency variation is not smaller than a threshold value; and making correction operation on the imaging data when an amount of a resonance frequency variation or resonance frequency is stored in correspondence to a certain phase encoding amount of imaging data after the collection of the imaging data for filling the k space.

25. A method of correcting a resonance frequency variation, comprising the steps of:

measuring an amount of a resonance frequency variation as well once out of a plurality of times when imaging data for filling a k space is collected by repeating a sequence of imaging pulses which differ in phase encoding amount a plurality of times;

correcting the frequency variation when the amount of the resonance frequency variation is smaller than a threshold value;

storing the amount of the resonance frequency variation or the resonance frequency in correspondence to the imaging data of the plurality of times without correcting the frequency variation when the amount of the resonance frequency variation is not smaller than the threshold value; and making correction operation on the imaging data when an amount of a resonance frequency variation or resonance frequency is stored in correspondence to a certain phase encoding amount of imaging data after the collection of the imaging data for filling the k space.

26. A method of correcting a resonance frequency variation, comprising the steps of:

measuring an amount of a resonance frequency variation as well once out of a plurality of times when imaging data for filling a k space is collected by repeating a sequence of imaging pulses which differ in phase encoding amount a plurality of times;

correcting the frequency variation;

storing the amount of the resonance frequency variation or the resonance frequency in correspondence to the imaging data of the plurality of times when the amount of the resonance frequency variation is not smaller than a threshold value; and making correction operation on the imaging data when an amount of a resonance frequency variation or resonance frequency is stored in correspondence to a certain phase encoding amount of imaging data after the collection of the imaging data for filling the k space.

27. A method of correcting a resonance frequency variation, comprising the steps of:

measuring an amount of a resonance frequency variation as well each time when imaging data for filling a k space is collected by repeating a sequence of imaging pulses which differ in phase encoding amount a plurality of times;

correcting the frequency variation;

storing the amount of the resonance frequency variation or the resonance frequency in correspondence to the imaging data of this time; and making correction operation on the imaging data after the collection of the imaging data for filling the k space.

28. A method of correcting a resonance frequency variation according to claim 27, wherein the resonance frequency is measured and a difference between the measured resonance frequency and a fixed resonance frequency is taken as the amount of the resonance frequency variation.

29. A method of correcting a resonance frequency variation according to claim 27, wherein the resonance frequency is measured and a difference between the measured resonance frequency and the previously measured resonance frequency is taken as the amount of the resonance frequency variation.

30. A method of correcting a resonance frequency variation according to claim 27, wherein the amount of a current running through a main magnetic field coil is adjusted to correct the frequency variation.

31. A method of correcting a resonance frequency variation according to claim 27, wherein a transmitting frequency is adjusted to correct the frequency variation.

32. A method of correcting a resonance frequency variation according to claim 27, wherein the transmitting frequency and a receiving frequency are adjusted to correct the frequency variation.

33. A method of correcting a resonance frequency variation according to claim 27, wherein a transmitting phase or a receiving phase is adjusted to correct the frequency variation.

34. A method of correcting a resonance frequency variation, comprising the steps of:

measuring an amount of a resonance frequency variation as well once out of a plurality of times when imaging data for filling a k space is collected by repeating a sequence of imaging pulses which differ in phase encoding amount a plurality of times;

correcting the frequency variation;

storing the amount of the resonance frequency variation or the resonance frequency in correspondence to the imaging data of the plurality of times; and making correction operation on the imaging data after the collection of the imaging data for filling the k space.

35. A method of correcting a resonance frequency variation according to claim 34, wherein the resonance frequency is measured and a difference between the measured resonance frequency and a fixed resonance frequency is taken as the amount of the resonance frequency variation.

36. A method of correcting a resonance frequency variation according to claim 34, wherein the resonance frequency is measured and a difference between the measured resonance frequency and the previously measured resonance frequency is taken as the amount of the resonance frequency variation.

37. A method of correcting a resonance frequency variation according to claim 34, wherein the amount of a current running through a main magnetic field coil is adjusted to correct the frequency variation.

38. A method of correcting a resonance frequency variation according to claim 34, wherein a transmitting frequency is adjusted to correct the frequency variation.

39. A method of correcting a resonance frequency variation according to claim 34, wherein the transmitting frequency and a receiving frequency are adjusted to correct the frequency variation.

40. A method of correcting a resonance frequency variation according to claim 34, wherein a transmitting phase or a receiving phase is adjusted to correct the frequency variation.

* * * * *

UNITED STATES PATENT AND TRADEMARK OFFICE
CERTIFICATE OF CORRECTION

PATENT NO.    : 6,552,539 B2
DATED         : April 22, 2003
INVENTOR(S)   : Nozomu Uetake It is certified that error appears in the above-identified patent and that said Letters Patent is hereby corrected as shown below:

<u>Column 16,</u>
Line 37, delete, "the correction of" and insert therefor -- the collection of --.

Signed and Sealed this

Ninth Day of September, 2003

JAMES E. ROGAN
*Director of the United States Patent and Trademark Office*